(12) United States Patent
Chang et al.

(10) Patent No.: US 8,159,281 B2
(45) Date of Patent: Apr. 17, 2012

(54) METHOD AND DEVICE FOR DELAYING ACTIVATION TIMING OF OUTPUT DEVICE

(75) Inventors: Hsiang-Chung Chang, Hsinchu (TW); Dong-Yi Liu, Miaoli County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 70 days.

(21) Appl. No.: 12/912,759

(22) Filed: Oct. 27, 2010

(65) Prior Publication Data

US 2011/0316601 A1 Dec. 29, 2011

(30) Foreign Application Priority Data

Jun. 23, 2010 (TW) .............................. 99120512 A (51) Int. Cl.
  *H03K 17/16* (2006.01)
(52) U.S. Cl. ......................... 327/387; 327/388; 323/317
(58) Field of Classification Search .......... 327/379–381, 327/387–389, 538, 540–541; 323/312, 315–317
  See application file for complete search history.

(56) References Cited

U.S. PATENT DOCUMENTS

| | | | | |
|---|---|---|---|---|
| 5,532,626 A | * | 7/1996 | Khayat | 327/53 |
| 6,320,365 B1 | * | 11/2001 | D'Angelo | 323/316 |
| 2011/0317317 A1 | * | 12/2011 | Liu et al. | 361/56 |

* cited by examiner

*Primary Examiner* — An Luu
(74) *Attorney, Agent, or Firm* — Winston Hsu; Scott Margo (57) ABSTRACT

A delay method for determining an activation moment of an output device in a circuit system is disclosed. The delay method includes determining resistance of an over-current flag pull-high resistor of the circuit system, generating a current according to the resistance of the over-current flag pull-high resistor and a voltage drop across the resistor, duplicating the current to generate a first mirror current, delaying an enable signal of the circuit system according to the first mirror current to generate a charging activation signal, providing a charging current according to the charging activation signal, and determining the activation moment of the output device according to the activation current.

24 Claims, 10 Drawing Sheets

METHOD AND DEVICE FOR DELAYING ACTIVATION TIMING OF OUTPUT DEVICE

BACKGROUND OF THE INVENTION

1. Field of the Invention

The present invention is related to a delay method and device, and more particularly, to a delay method and device for staggering activation moments of output devices.

2. Description of the Prior Art

A Universal Serial Bus (USB) is a convenient and economic solution for electrical connection, especially for "hot attach and detach" and "plug and play" applications. Characterized by expansibility, easy installation and high transmission rate, the USB is widely employed in computer systems, and is utilized for connecting the computer systems with USB peripherals, such as a keyboard, mouse, portable hard disk, compact disc read-only memory (CD-ROM) drive, joystick, printer, scanner, etc.

Figure 1A:
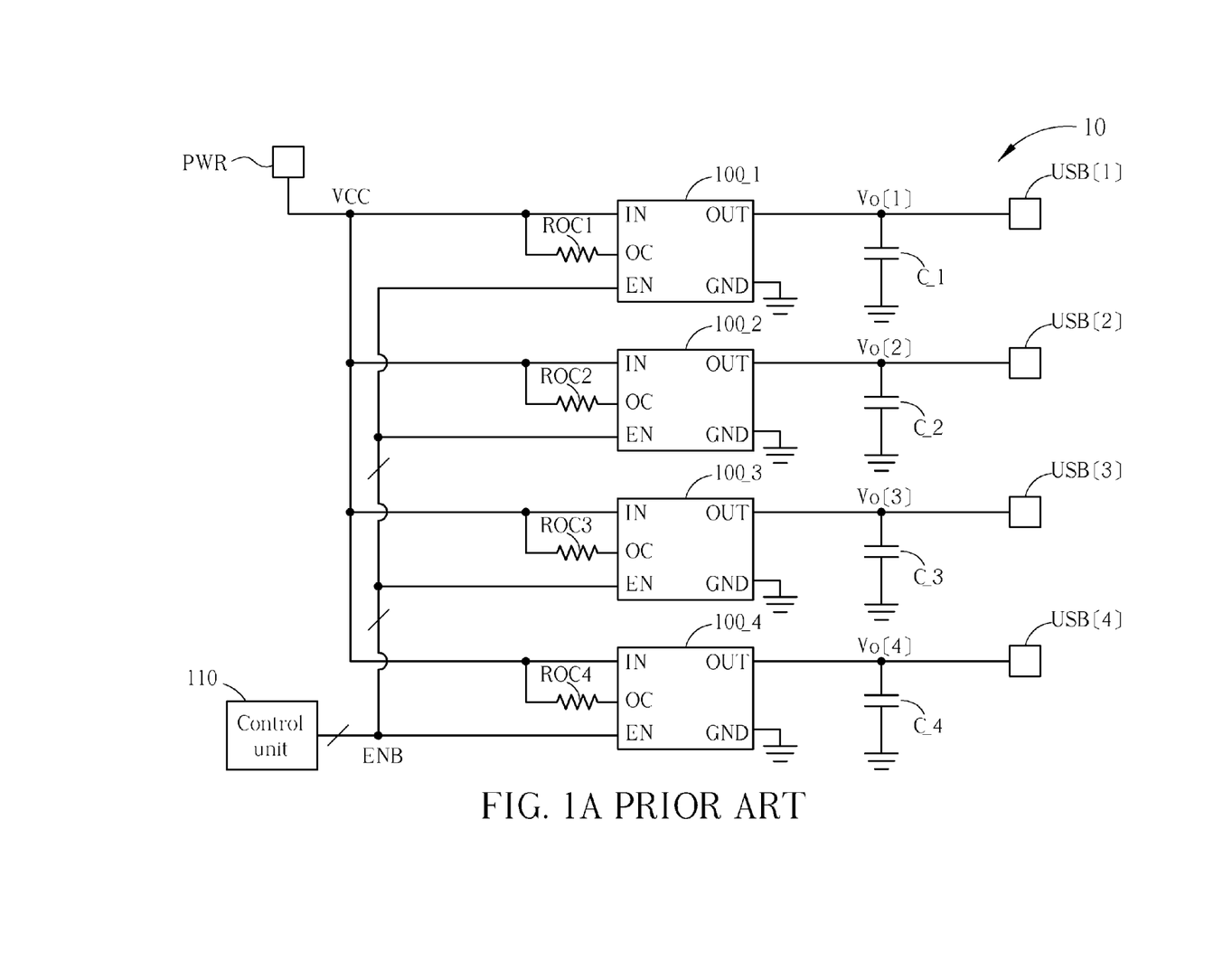
FIG. 1A is a schematic diagram of a circuit system of the prior art.

Please refer to FIG. 1A, which is a schematic diagram of a circuit system 10 of the prior art. The circuit system 10 is generally installed on a main board of a computer system to provide power conforming to USB standards. The circuit system 10 includes a power end PWR, switch units 100_1, 100_2, 100_3, 100_4, a control unit 110 and output ports USB[1], USB[2], USB[3], USB[4]. When the computer system is powered on, the control unit 110 generates an enable signal ENB to respectively indicate to the switch units 100_1, 100_2, 100_3, 100_4 to connect the power end PWR and the output ports USB[1], USB[2], USB[3], USB[4], so as to provide output voltages Vo[1], Vo[2], Vo[3], Vo[4] according to a supply voltage VCC received by the power end PWR and charge output capacitors C_1, C_2, C_3, C_4. As a result, the output voltages Vo[1], Vo[2], Vo[3], Vo[4] can be respectively transmitted to external electronic devices via the output ports USB[1], USB[2], USB[3], USB[4].

To protect the circuit system 10, each of the switch units 100_1, 100_2, 100_3, 100_4 is installed with an over-current signal end OC coupled to the power end PWR via an over-current flag pull-high resistor (ROC1, ROC2, ROC3 or ROC4) and utilized for informing the circuit system if an over-current condition is triggered, so as to prevent the circuit system 10 and the external electronic devices from burnout induced by overloaded currents. That is, the over-current flag pull-high resistors ROC1, ROC2, ROC3, ROC4 function as current sources capable of pulling high voltages of the over-current signal ends OC.

Figure 1B:
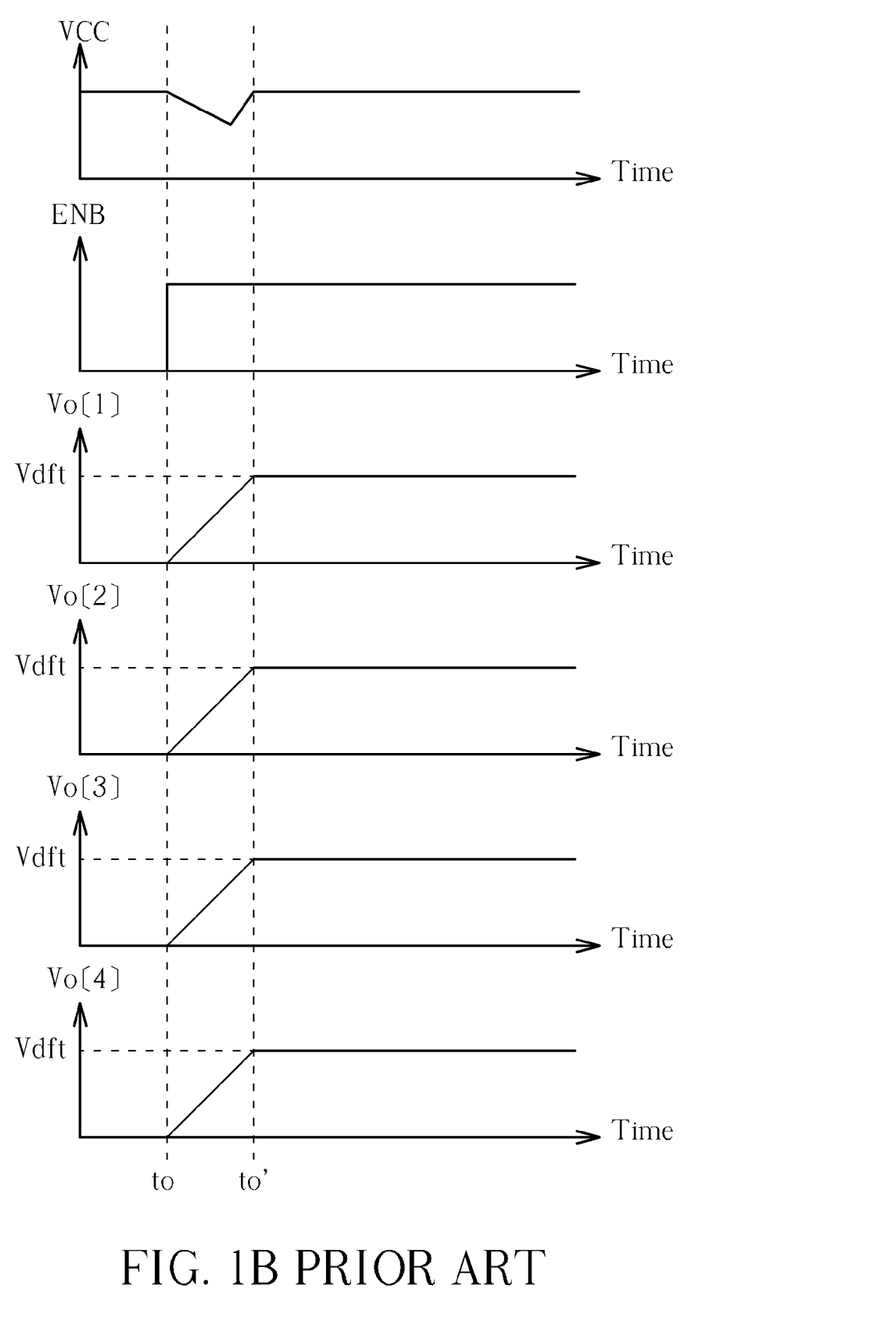

When all the output ports USB[1], USB[2], USB[3], USB[4] are connected to external electronic devices, the circuit system 10 may break down, since current demand explodes. Please refer to FIG. 1B, which is a timing diagram of related signals when the circuit system 10 is powered on. In FIG. 1B, the enable signal ENB indicates to the switch units 100_1, 100_2, 100_3, 100_4 to start operating at a moment t0, and accordingly the output voltages Vo[1], Vo[2], Vo[3], Vo[4] start increasing at the moment t0 and reach a default voltage Vdft at a moment t0'. However, if the output ports USB[1], USB[2], USB[3], USB[4] are respectively connected to four external electronic devices, the four external electronic devices simultaneously draw current from the circuit system 10 when the circuit system 10 is powered on, resulting in a voltage drop in the supply voltage VCC from the moment t0 to the moment t0'. In the worst case, the voltage drop triggers under voltage protection of other circuit systems sharing the power end PWR with the circuit system 10, which will cause function error or crash of the entire system.

Figure 2A:
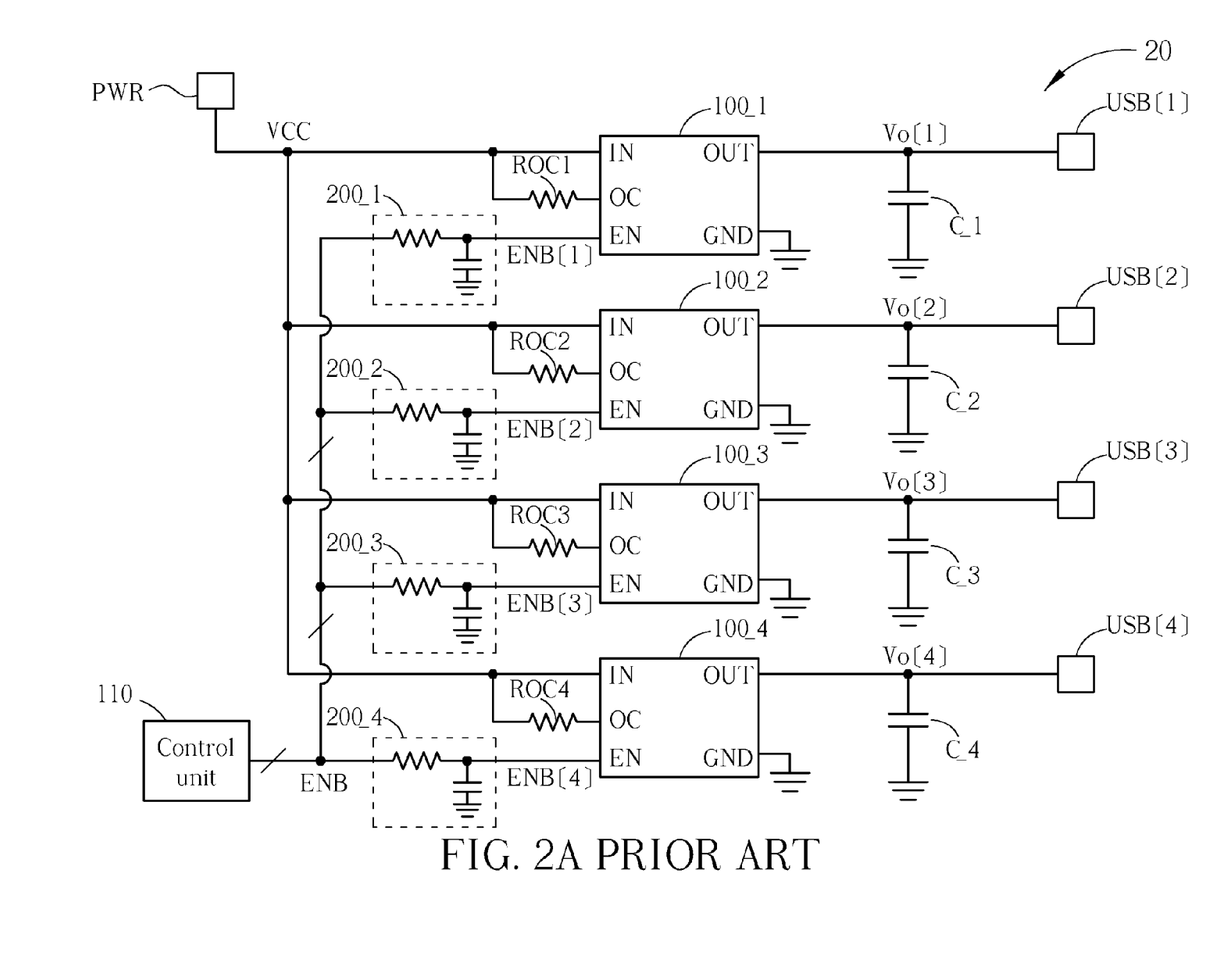
FIG. 2A is a schematic diagram of another circuit system of the prior art.
Figure 2B:
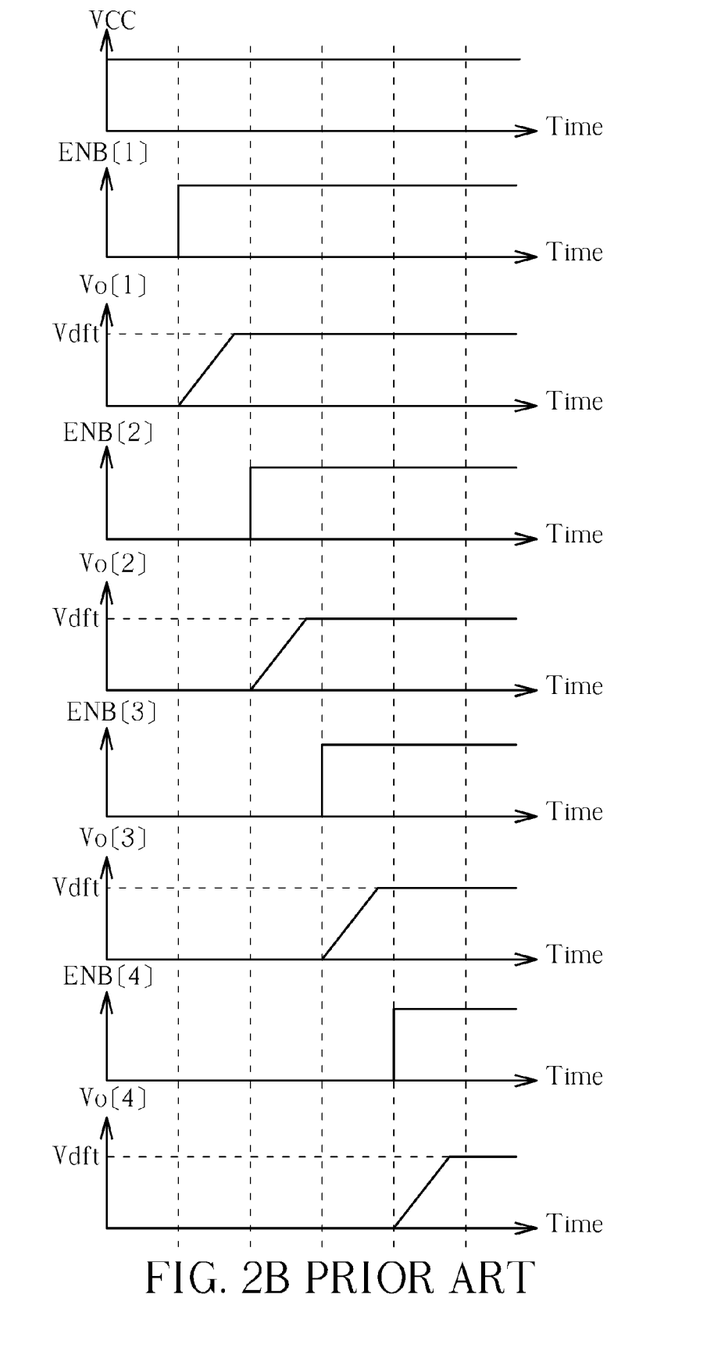

Please refer to FIG. 2A, which is a schematic diagram of another circuit system 20 for preventing the voltage drop of the supply voltage VCC of the prior art. Compared to the circuit system 10, the circuit system 20 additionally includes time delay modules 200_1, 200_2, 200_3, 200_4 utilized for delaying the enable signal ENB for different periods through various combinations of capacitance and resistance to generate enable signals ENB[1], ENB[2], ENB[3], ENB[4]. In FIG. 2B, activation moments of the enable signals ENB [1], ENB [2], ENB[3], ENB[4] are staggered. As a result, the switch units 100_1, 100_2, 100_3, 100_4 start functioning at different moments, and therefore the supply voltage VCC no longer drops due to the over-drawn currents. However, the time delay modules 200_1, 200_2, 200_3, 200_4 include capacitors and resistors which are disadvantageous to manufacturing costs and system design flexibility.

Therefore, staggering the activation moments of the switch units more economically has been a major focus of the industry.

SUMMARY OF THE INVENTION

It is therefore a primary objective of the claimed invention to provide a delay method and device using the same.

The present invention discloses a delay method for determining an activation moment of an output device in a circuit system. The delay method comprises determining resistance of an over-current flag pull-high resistor of the circuit system, generating a current according to the resistance of the over-current flag pull-high resistor, duplicating the current to generate a first mirror current, delaying an enable signal of the circuit system according to the first mirror current to generate a charging activation signal, providing a charging current according to the charging activation signal, and determining the activation moment of the output device according to the charging current.

The present invention further discloses an output device for outputting an output voltage according to an enable signal. The output device comprises an input end for receiving a supply voltage, an output end for outputting the output voltage, an over-current signal end coupled to a power end via an over-current flag pull-high resistor for generating an over-current voltage, an enable end for receiving the enable signal, a current source for providing a charging current according to a charging activation signal, an output transistor comprising a drain end coupled to the input end, a source end coupled to the output end, and a gate end coupled to the current source for determining whether the input end is electrically connected to the output end according to the charging current, a current mirror module coupled to the over-current signal end for generating a current according to the over-current voltage, and duplicating the current to generate a first mirror current, and a delay module coupled to the current mirror module, the enable end and the current source for delaying the enable signal according to the first mirror current to generate the charging activation signal.

The present invention further discloses a circuit system for outputting at least one output voltage according to an enable signal. The circuit system comprises a power end for receiving a supply voltage, at least one output port for outputting the at least one output voltage, a control unit for generating the enable signal, and at least one response control channel, each coupled to the power end and one of the at least one output port and comprising an over-current flag pull-high resistor comprising a first end coupled to the power end and a second end for modulating a response time for the enable signal, an output device coupled to the power end the control unit, a ground end, the output port and the second end of the over-current flag pull-high resistor for electrically connecting the power end and the output port according to the enable signal, and delaying a moment when the power end is electrically connected to the output port according to resistance of the over-current flag pull-high resistor, and an output capacitor comprising one end coupled between the output device and the output port and the other end coupled to the ground end for generating one of the at least one output voltage according to a conduction status of the output device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1B is a timing schematic diagram of related signals when the circuit system shown in FIG. 1A is powered on.

FIG. 2B is a timing schematic diagram of related signals when the circuit system shown in FIG. 2A is powered on.

FIG. 5A and FIG. 5B are timing schematic diagrams of related signals when the circuit system shown in FIG. 3A is powered on.

DETAILED DESCRIPTION

Figure 3A:
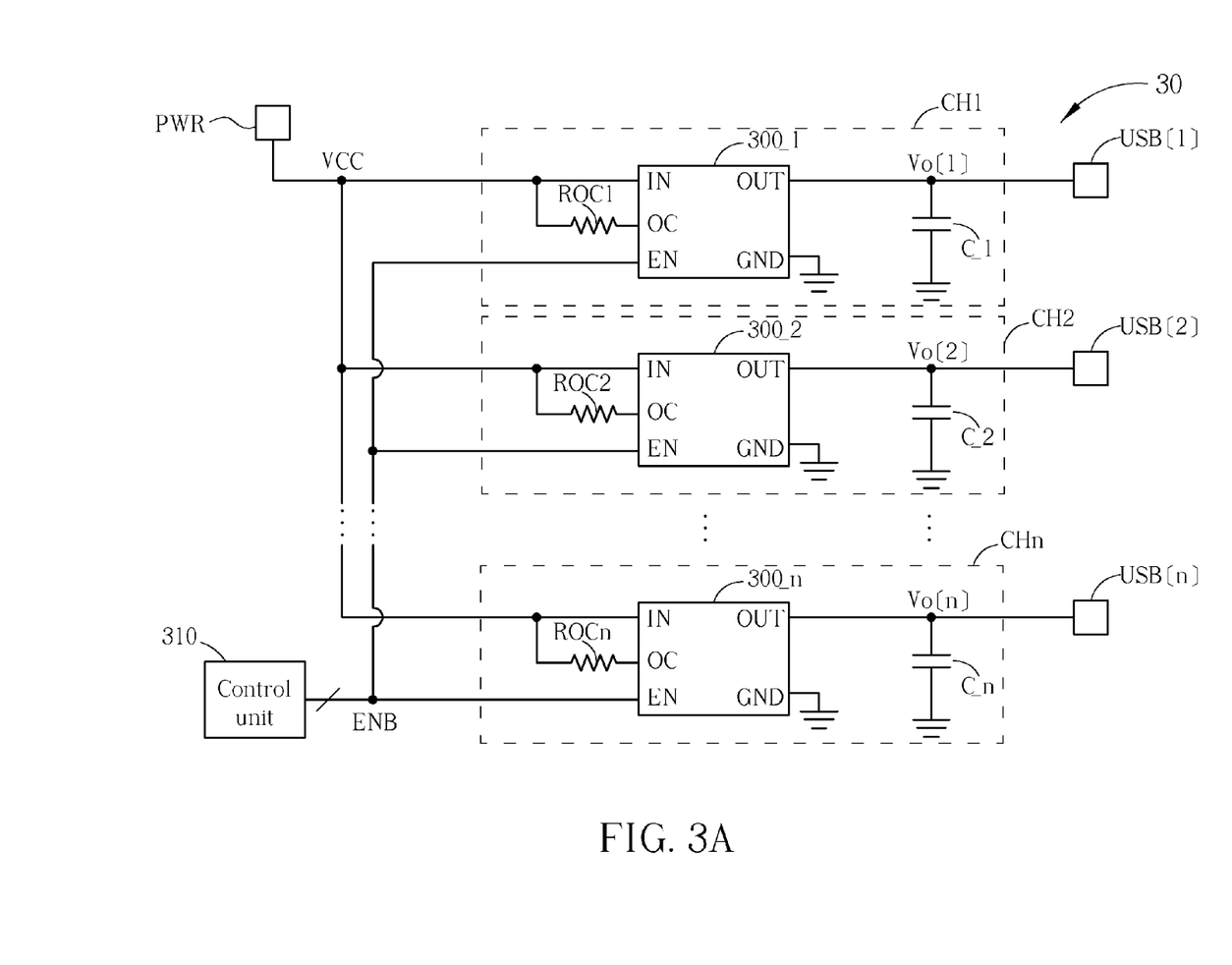
FIG. 3A is a schematic diagram of a circuit system according to an embodiment of the present invention.

Please refer to FIG. 3A, which is a schematic diagram of a circuit system 30 according to an embodiment of the present invention. The circuit system 30 includes a power end PWR, a control unit 310, response control channels CH1-CHn and output ports USB[1]-USB[n]. The response control channels CH1-CHn correspondingly include output devices 300_1-300_n, over-current flag pull-high resistors ROC1-ROCn and output capacitors C_1-C_n. The circuit system 30 is similar to the circuit system 10 shown in FIG. 1, and differs in that the over-current flag pull-high resistors ROC1-ROCn are characterized by having different resistances to stagger activation moments of the output devices 300_1-300_n. The power end PWR is utilized for receiving a supply voltage VCC. The output ports USB[1]-USB[n] are utilized for outputting output voltages Vo[1]-Vo[n]. The control unit 310 is utilized for generating an enable signal ENB to activate the output devices 300_1-300_n. The output devices 300_1-300_n are utilized for determining whether to transmit the supply voltage VCC to the output ports USB[1]-USB[n] according to the enable signal ENB, and delaying moments when the power end PWR is electrically connected to the output ports USB[1]-USB[n] according to resistances of the over-current flag pull-high resistors ROC1-ROCn. That is, the over-current flag pull-high resistors ROC1-ROCn are further utilized for controlling "response rates" of the output devices 300_1-300 in response to the enable signal ENB.

In short, to stagger the activation moments of the output devices 300_1-300_n without applying a resistance-capacitance (RC) delay method and complex control circuits, the over-current flag pull-high resistors ROC1-ROCn are further utilized for delaying the activation moments of the output devices 300_1-300_n. That is, main architecture of the circuit system 10 shown in FIG. 1A is preserved, and only the resistances of the over-current flag pull-high resistors ROC1-ROCn are adjusted to economically stagger the activation moments of the output devices 300_1-300_n.

Certainly, in order to delay the activation moments, the output devices 300_1-300_n are designed with corresponding signal processing schemes. Please refer to FIG. 3B, which is a schematic diagram of an output device 300_x of the output devices 300_1-300_n. The output device 300_x includes a current source 311, an output transistor 320, a current mirror module 330 and a delay module 350. The current source 311 is utilized for providing a charging current Ichr according to a charging activation signal ACT. The output transistor 320 is utilized for determining whether an input end IN is electrically connected to an output end OUT according to the charging current Ichr to determine whether to transmit the supply voltage VCC received by the input end IN to the output end OUT. The current mirror module 330 is utilized for generating a current Iptc according to an over-current voltage VOC and duplicating the current Iptc to generate a first mirror current Imr1. Finally, the delay module 350 delays the enable signal ENB according to the first mirror current Imr1 to generate the charging activation signal ACT lagging the enable signal ENB in phase.

Figure 3B:
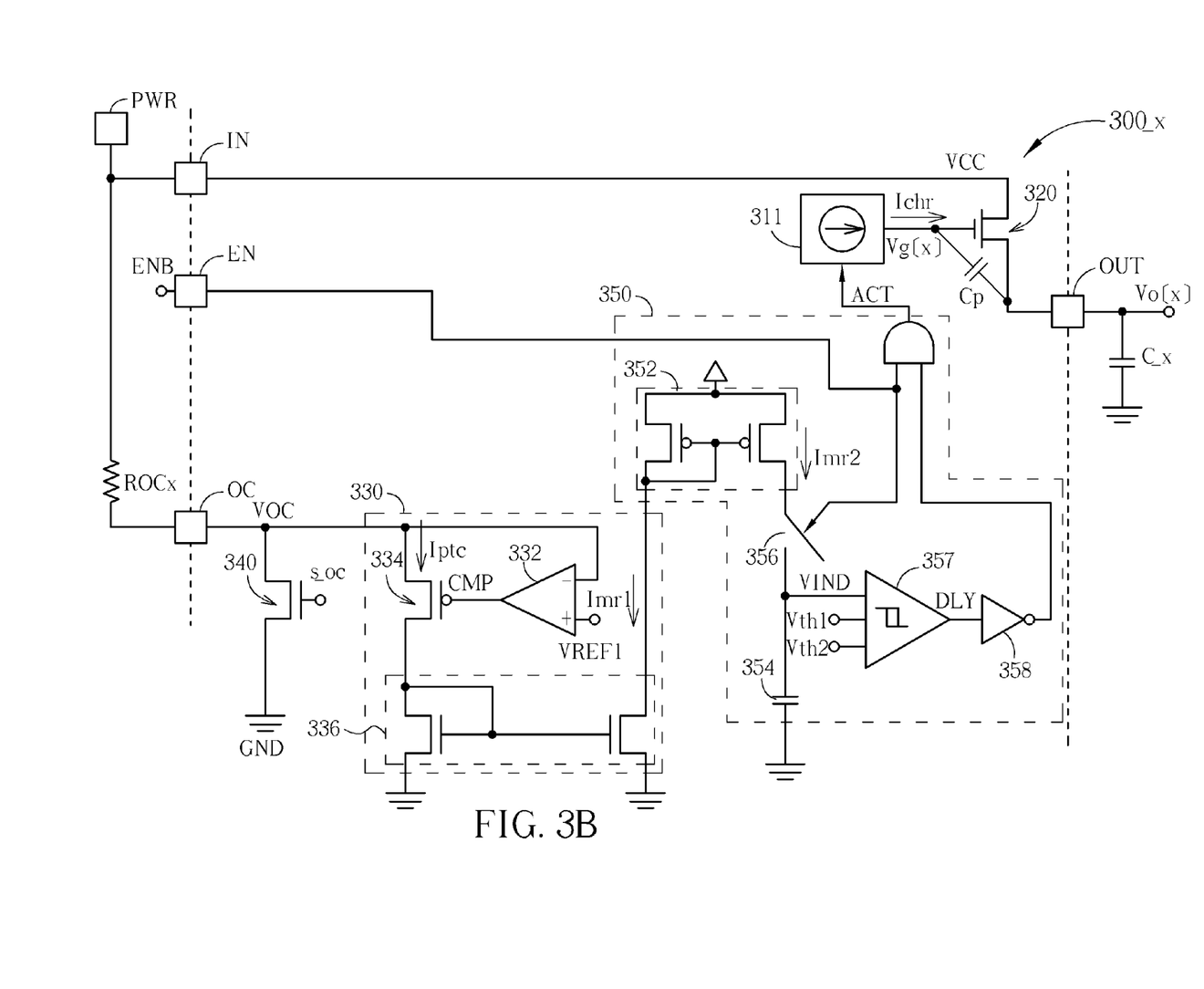
FIG. 3B is a schematic diagram of an output device of the circuit system shown in FIG. 3A.

In detail, the delay module 350 includes a first current mirror 352, a capacitor 354, a switch 356, a delay comparator 357, an inverter 358 and a logic unit 359. The first current mirror 352 is utilized for duplicating the first mirror current Imr1 to generate a second mirror current Imr2. The capacitor 354 is utilized for generating an indication voltage VIND according to the second mirror current Imr2. The switch 356 is utilized for determining whether the second mirror current Imr2 charges the capacitor 354 based on the enable signal ENB. The delay comparator 357 is utilized for comparing the indication voltage VIND with a first threshold voltage Vth1 and a second threshold voltage Vth2 to generate a delay signal DLY. The inverter 358 inverts the delay signal DLY, and therefore generates an inverted delay signal DLY'. The logic unit 359 generates the charging activation signal ACT according to the enable signal ENB and the inverted delay signal DLY'.

Figure 4:
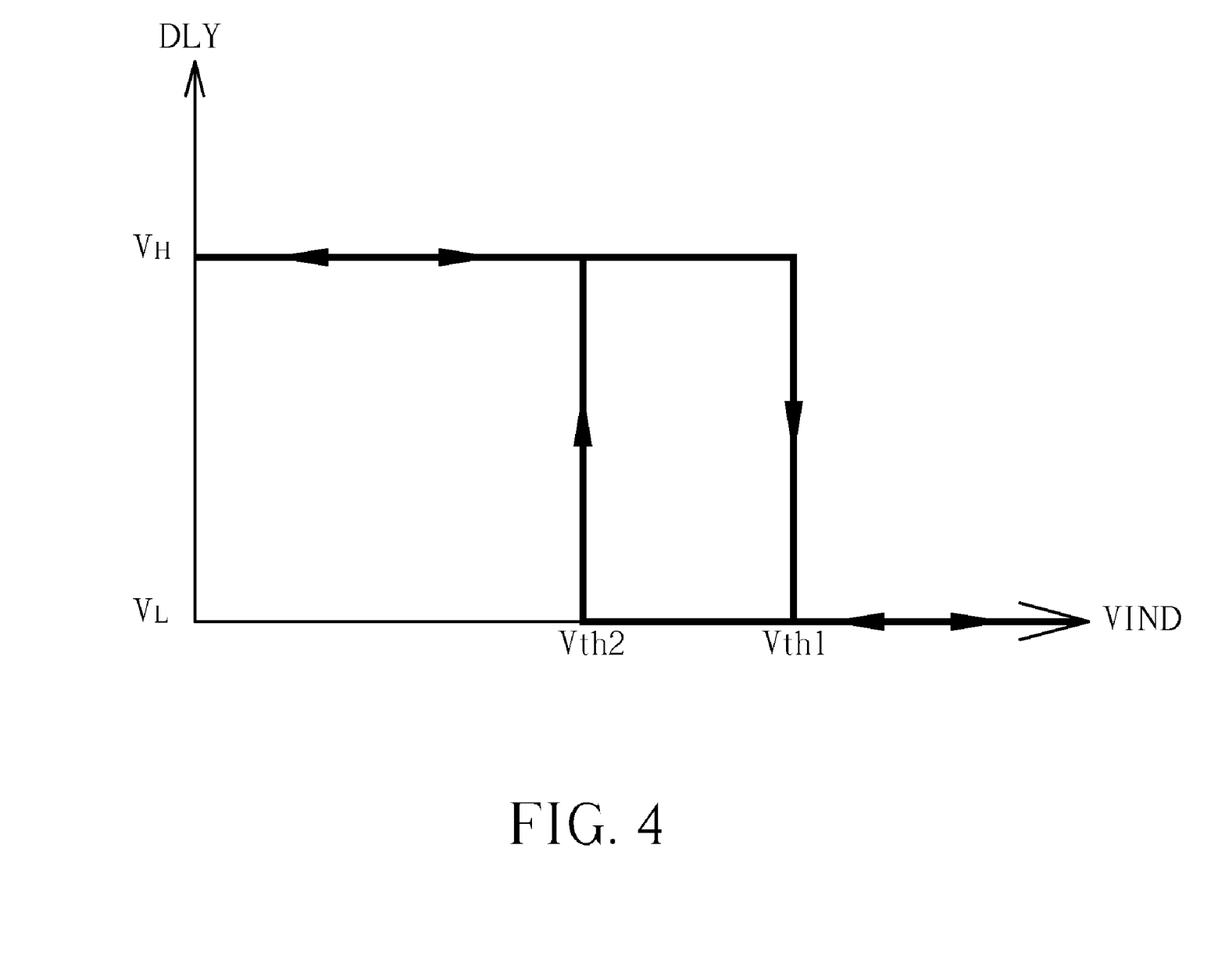
FIG. 4 is a schematic diagram of an input/output relationship of a delay comparator shown in FIG. 3B.

As to operations of the delay comparator 357, please refer to FIG. 4, which is a schematic diagram of an input/output relationship of the delay comparator 357. In FIG. 4, when the indication voltage VIND increases to be higher than the first threshold voltage Vth1, the delay signal DLY switches from a high potential $V_H$ to a low potential $V_L$. Inversely, when the indication voltage VIND decreases to be lower than the second threshold voltage Vth2, the delay signal DLY switches from the low potential $V_L$ to the high potential $V_H$. That is, through controlling the resistances of the over-current flag pull-high resistors ROC1-ROCn, charging rates of the capacitors 354 can be adjusted to stagger triggering moments for the current sources 310. Note that, the logic unit 359 is preferably an AND gate.

Figure 5A:
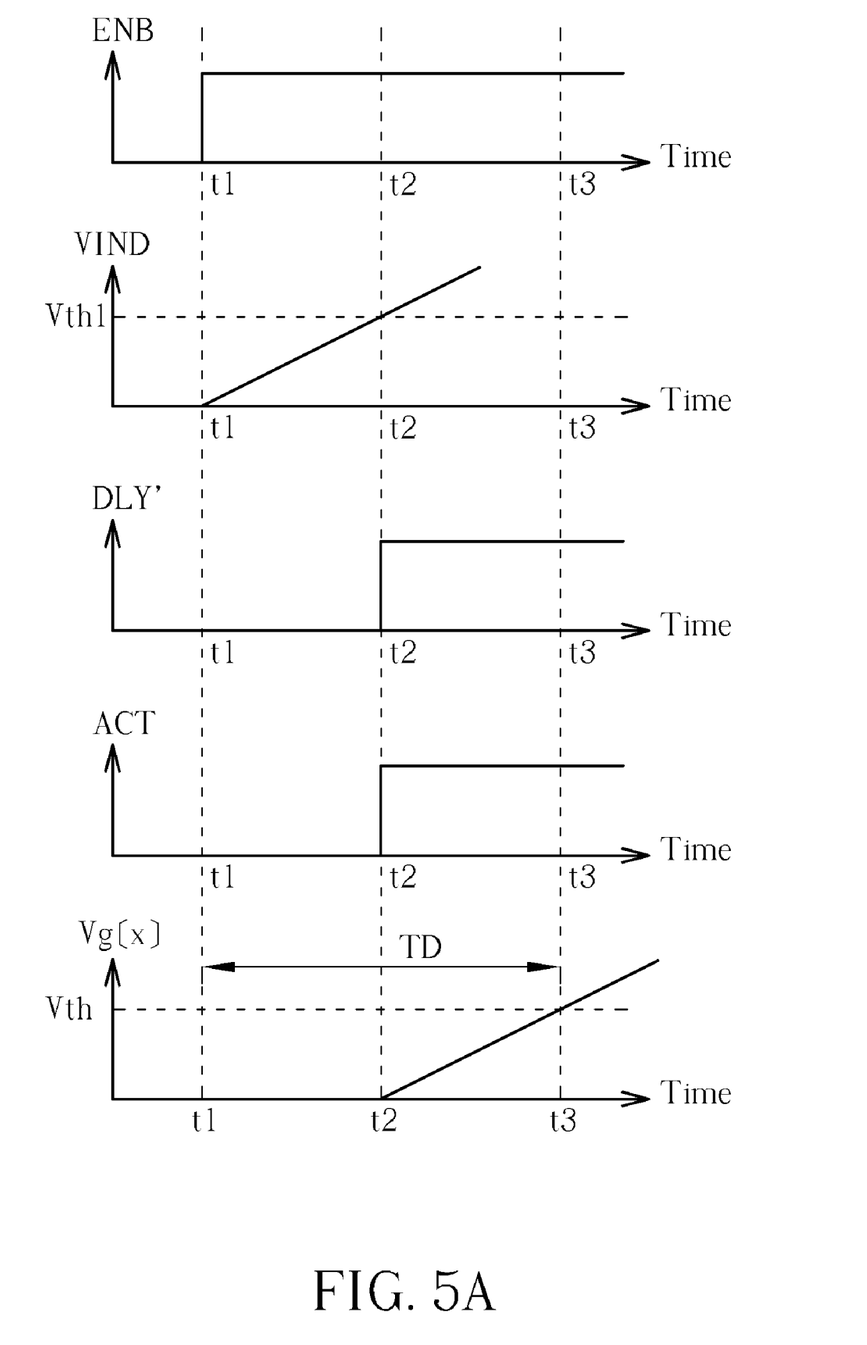
Figure 5B:
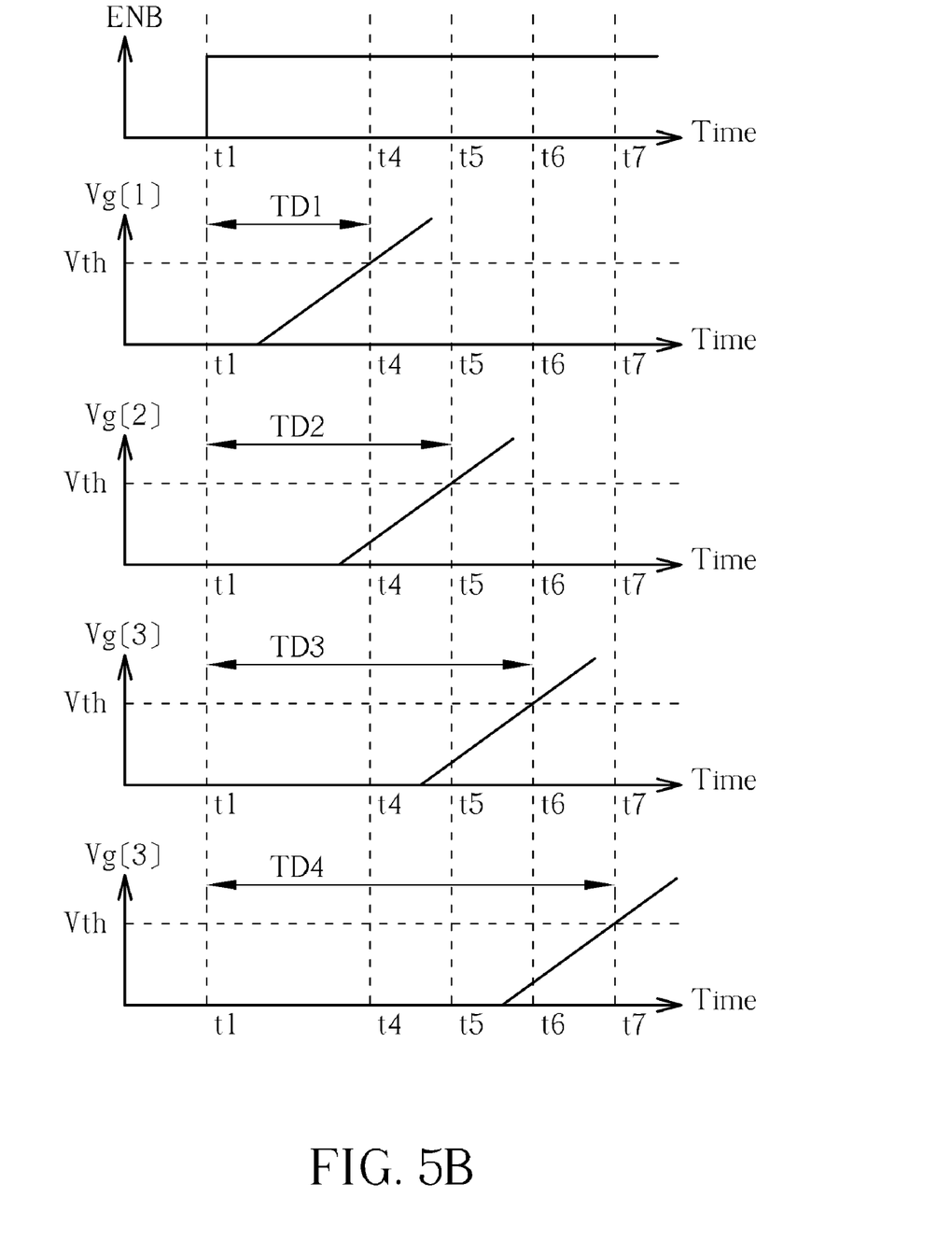

For example, please refer to FIG. 5A, which is a timing schematic diagram of related signals of the output device 300_x when the circuit system 30 is powered on. In FIG. 5A, the enable signal ENB is activated at a moment t1. Accordingly, the switch 356 is enabled at the moment t1, and the second mirror current Imr2 starts charging the capacitor 354 at the moment t1. In such a situation, a rising rate of the indication voltage VIND is determined based on flow of the second mirror current Imr2. Once the indication voltage VIND is greater than the first threshold voltage Vth1 (moment t2), the inverted delay signal DLY' switches from "0" to "1" and triggers the charging activation signal ACT to switch from "0" to "1" to indicate the current source 311 to start providing the charging current Ichr to a gate of the output transistor 320. Since the charging current Ichr charges a parasitic capacitor Cp between the gate and a source of the output transistor 320, the output transistor 320 is enabled when a gate voltage Vg[x] of the output transistor 320 is greater than a threshold voltage Vth of the output transistor 320 (moment t3). As a result, the output device 300_x starts transmitting the supply voltage VCC to the output end OUT at the moment t3. That is, the output device 300_x delays the enable signal ENB for a time difference TD between the moments t1, t3. Note that, the time difference TD can be controlled by varying the resistance of the over-current flag pull-high resistors ROCx. For example, if n=4 and resistances of the over-current flag pull-high resistors ROC1-ROC4 are different, gate voltages Vg[1], Vg[2], Vg[3], Vg[4] of the output transistors 320 of the output devices 300_1-300_4 are triggered at different moments, and therefore the output devices 300_1-300_4 are delayed for time differences TD1-TD4 and start operating at moments t4-t7 respectively, as illustrated in FIG. 5B. As a result, the supply voltage VCC no longer drops due to over-drawn currents. That is, the over-current flag pull-high resistor ROCx is utilized for controlling a "response rate" of the output device 300_x in response to the enable signal ENB to avoid applying large capacitors, which are disadvantageous to device size and manufacturing costs.

In addition, to set up a condition for triggering the delay scheme, the current mirror module 330 includes an operational amplifier 332, a p-type transistor 334 and a second current mirror 336. The operational amplifier 332 is utilized for comparing the over-current voltage VOC and a reference voltage VREF to generate a computation result CMP. The p-type transistor is utilized for generating the current Iptc according to the computation result CMP. The second current mirror 336 is utilized for duplicating the current Iptc to generate the first mirror current Imr1. That is, the current mirror module 330 determines whether to delay the enable signal ENB according to the over-current voltage VOC and the reference voltage VREF.

Therefore, through adjusting the over-current voltage VOC or the reference voltage VREF, the moment that the current source 310 starts providing the charging current Ichr can be controlled, so as to determine the moment when the gate voltage Vg[x] starts increasing as well as the activation moment of the output transistor 320.

On the other hand, to preserve the original over-current protection function, the output device 300_x further includes an over-current transistor 340 for determining whether the over-current flag pull-high resistor ROCx is electrically connected to a ground end GND according to an over-current signal s_oc, so as to prevent the over-drawn currents from damaging the output device 300_x and an external electronic device connected to the output port USB[x], such as a portable hard disk, digital camera, etc.

Preferably, the circuit system 30 is a Universal Serial Bus (USB) switch device for determining whether to transmit the supply voltage VCC to the output end OUT according to the enable signal ENB. Certainly, the delay method of the present invention can be applied to all output devices designed with over-current flag pull-high resistors, and is not limited to the USB switch device. The present invention staggers the activation moments of the output devices 300_1-300_n without employing any large capacitors to economically avoid the voltage drop of the supply voltage VCC caused by over-drawn currents.

Figure 6:
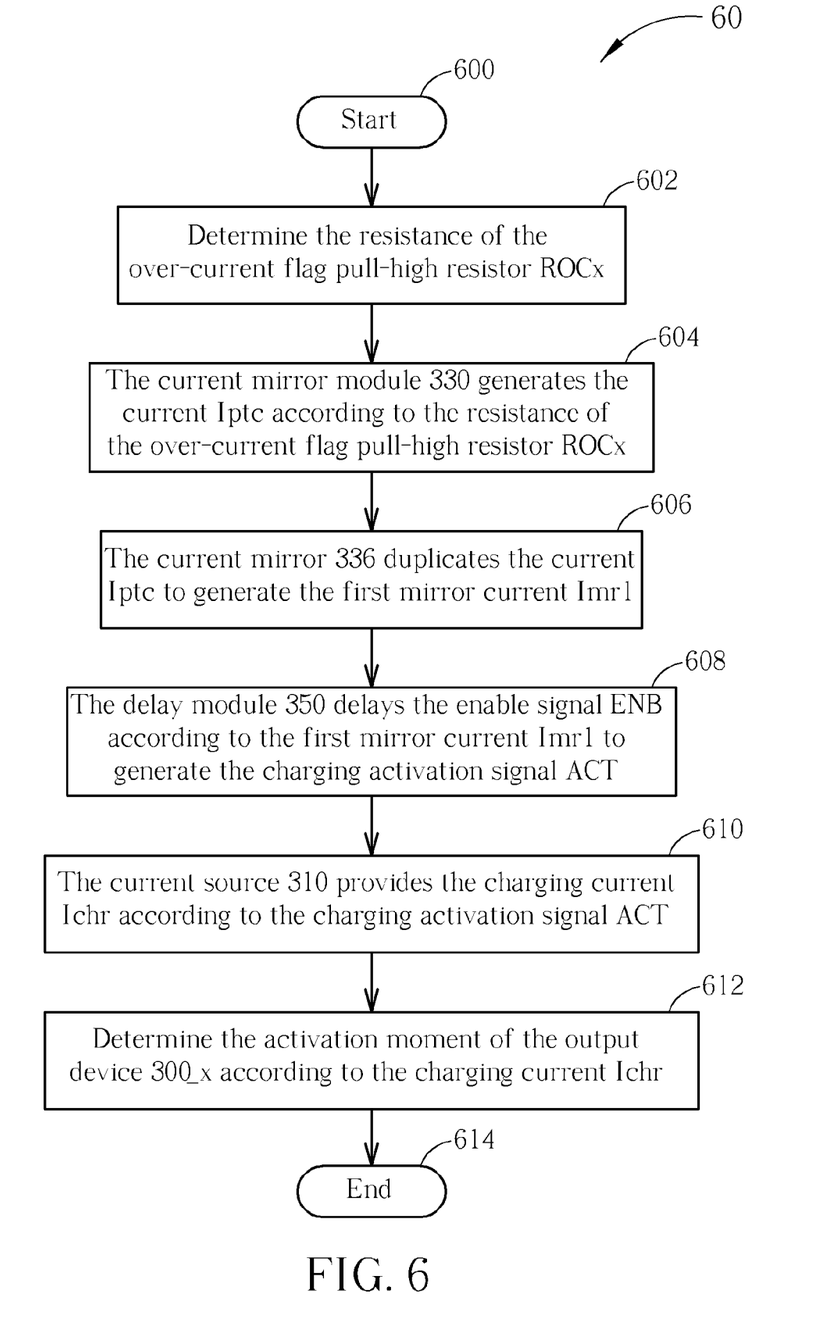
FIG. 6 is a schematic diagram of a process according to an embodiment of the present invention.

Operations of the output device 300_x can be summarized into a process 60, as illustrated in FIG. 6. The process 60 includes the following steps:

Step 600: Start.

Step 602: Determine the resistance of the over-current flag pull-high resistor ROCx.

Step 604: The current mirror module 330 generates the current Iptc according to the resistance of the over-current flag pull-high resistor ROCx.

Step 606: The current mirror 336 duplicates the current Iptc to generate the first mirror current Imr1.

Step 608: The delay module 350 delays the enable signal ENB according to the first mirror current Imr1 to generate the charging activation signal ACT.

Step 610: The current source 310 provides the charging current Ichr according to the charging activation signal ACT.

Step 612: Determine the activation moment of the output device 300_x according to the charging current Ichr.

Step 614: End.

Details of the process 60 can be referred in the above, and are not further narrated herein.

In the prior art, to stagger the activation moments of the switch units 100_1, 100_2, 100_3, 100_4, the circuit system 20 has to employ large capacitors to respectively delay the enable signal ENB as enable signals EN[1], EN[2], EN[3], EN[4]. However, the usage of the large capacitors dramatically increases manufacturing costs and design limitations of the circuit system 20. In comparison, the present invention adjusts the activation moments of the output transistors 320 through varying the resistances of the over-current flag pull-high resistors ROC1-ROCn, so as to stagger the activation moments of the output devices 300_1-300_n. As a result, the circuit system 30 can disperse the activation moments of the output devices 300_1-300_n without applying the RC delay method, so as to economically avoid the voltage drop of the supply voltage VCC caused by the over-drawn currents.

To sum up, the present invention staggers the activation moments of the output devices through varying the resistances of over-current flag pull-high resistors to avoid the voltage drop of the supply voltage caused by the over-drawn currents without applying the RC delay method.

Those skilled in the art will readily observe that numerous modifications and alterations of the device and method may be made while retaining the teachings of the invention.

What is claimed is:

1. A delay method for determining an activation moment of an output device in a circuit system, the delay method comprising:

determining resistance of an over-current flag pull-high resistor of the circuit system;

generating a current according to the resistance of the over-current flag pull-high resistor;

duplicating the current to generate a first mirror current;

delaying an enable signal of the circuit system according to the first mirror current to generate a charging activation signal;

providing a charging current according to the charging activation signal; and determining the activation moment of the output device according to the charging current.

2. The delay method of claim 1, wherein the step of duplicating the current to generate the first mirror current comprises:

comparing an over-current voltage of the output device and a reference voltage to generate a computation result;

generating the current according to the computation result; and duplicating the current to generate the first mirror current.

3. The delay method of claim 1, wherein the step of delaying the enable signal of the circuit system according to the first mirror current to generate the charging activation signal comprises:

duplicating the first mirror current to generate a second mirror current;

determining whether to increase an indication voltage by the second mirror current according to the enable signal;

comparing the indication voltage with a first threshold voltage and a second threshold voltage to generate a delay signal, wherein the first threshold voltage is greater than the second threshold voltage;

inverting the delay signal; and generating the charging activation signal according to the enable signal and the inverted delay signal.

4. The delay method of claim 3, wherein the step of generating the charging activation signal according to the enable signal and the inverted delay signal comprises generating the charging activation signal when a conjunction of the enable signal and the inverted delay signal is enabled.

5. The delay method of claim 1, wherein the over-current flag pull-high resistor is coupled between an over-current signal end of the output device and a power end of the circuit system, and is utilized for determining flow of the current.

6. The delay method of claim 1, wherein the step of determining the activation moment of the output device according to the charging current comprises:

the charging current charging a gate of an output transistor of the output device; and assigning a moment when a gate voltage of the gate reaches a threshold voltage of the output transistor as the gate is charged to be the activation moment.

7. The delay method of claim 1, wherein the output device is a Universal Serial Bus (USB) switch device for determining whether the circuit system is electrically connected to an external electronic device via a USB according to the enable signal.

8. An output device for outputting an output voltage according to an enable signal, the output device comprising:

an input end, for receiving a supply voltage;

an output end, for outputting the output voltage;

an over-current signal end, coupled to a power end via an over-current flag pull-high resistor, for generating an over-current voltage;

an enable end, for receiving the enable signal;

a current source, for providing a charging current according to a charging activation signal;

an output transistor, comprising a drain end coupled to the input end, a source end coupled to the output end, and a gate end coupled to the current source, for determining whether the input end is electrically connected to the output end according to the charging current;

a current mirror module, coupled to the over-current signal end, for generating a current according to the over-current voltage, and duplicating the current to generate a first mirror current; and a delay module, coupled to the current mirror module, the enable end and the current source, for delaying the enable signal according to the first mirror current to generate the charging activation signal.

9. The output device of claim 8, wherein the delay module comprises:

a first current mirror, coupled to the current mirror module, for duplicating the first mirror current to generate a second mirror current;

a capacitor, coupled to a ground end, for generating an indication voltage according to the second mirror current;

a switch, coupled between the capacitor and the first current mirror, for determining whether the first current mirror is electrically connected to the capacitor according to the enable signal;

a delay comparator, coupled to the switch and the capacitor, for comparing the indication voltage with a first threshold voltage and a second threshold voltage to generate a delay signal, wherein the first threshold voltage is greater than the second threshold voltage;

an inverter, coupled to the delay comparator, for inverting the delay signal; and a logic unit, coupled to the enable end, the inverter and the current source, for generating the charging activation signal according to the enable signal and the inverted delay signal.

10. The output device of claim 9, wherein the logic unit is an AND gate.

11. The output device of claim 8, wherein the current mirror module comprises:

an operational amplifier, coupled to the over-current signal end, for comparing the over-current voltage and a reference voltage to generate a computation result;

a p-type transistor, comprising a source end coupled to the over-current signal end, a gate end coupled to the operational amplifier, and a drain end, for generating the current according to the computation result; and a second current mirror, coupled to the p-type transistor and a ground end, for duplicating the current to generate the first mirror current.

12. The output device of claim 8 further comprising an over-current transistor, coupled between the over-current signal end and a ground end, for determining whether the over-current signal end is electrically connected to the ground end according to an over-current signal.

13. The output device of claim 8, wherein the over-current flag pull-high resistor is coupled between the over-current signal end and the power end, and is utilized for determining flow of the current.

14. The output device of claim 8, wherein the current source charges the gate end of the output transistor by the charging current to determine an activation moment of the gate end.

15. The output device of claim 8, which is a Universal Serial Bus (USB) switch device for determining whether the supply voltage is provided to an external electronic device according to the enable signal.

16. A circuit system for outputting at least one output voltage according to an enable signal, the circuit system comprising:

a power end, for receiving a supply voltage;

at least one output port, for outputting the at least one output voltage;

a control unit, for generating the enable signal; and at least one response control channel, each coupled to the power end and one of the at least one output port and comprising:

an over-current flag pull-high resistor, comprising a first end coupled to the power end, and a second end, for modulating a response time for the enable signal;

an output device, coupled to the power end, the control unit, a ground end, the output port and the second end of the over-current flag pull-high resistor, for electrically connecting the power end and the output port according to the enable signal, and delaying a moment when the power end is electrically connected to the output port according to resistance of the over-current flag pull-high resistor; and an output capacitor, comprising one end coupled between the output device and the output port, and the other end coupled to the ground end, for generating one of the at least one output voltage according to a conduction status of the output device.

17. The circuit system of claim 16, wherein the output device comprises:

an input end, coupled to the power end, for receiving the supply voltage;

an output end, coupled to the output port, for outputting the output voltage;

an over-current signal end, coupled to the second end of the over-current flag pull-high resistor, for generating an over-current voltage;

an enable end, coupled to the control unit, for receiving the enable signal;

a current source, for providing a charging current according to a charging activation signal;

an output transistor, comprising a drain end coupled to the input end, a source end coupled to the output end, and a gate end coupled to the current source, for determining whether the input end is electrically connected to the output end according to the charging current;

a current mirror module, coupled to the over-current signal end, for generating a current according to the over-current voltage, and duplicating the current to generate a first mirror current; and a delay module, coupled to the current mirror module, the enable end and the current source, for delaying the enable signal according to the first mirror current to generate the charging activation signal for controlling the response time;

wherein the response time is a time difference between a moment when the enable signal starts indicating to enable the output device and a moment when the output transistor is practically enabled.

18. The circuit system of claim 17, wherein the delay module comprises:

a first current mirror, coupled to the current mirror module, for duplicating the first mirror current to generate a second mirror current;

a capacitor, coupled to the ground end, for generating an indication voltage according to the second mirror current;

a switch, coupled between the capacitor and the first current mirror, for determining whether the first current mirror is electrically connected to the capacitor according to the enable signal;

a delay comparator, coupled to the switch and the capacitor, for comparing the indication voltage with a first threshold voltage and a second threshold voltage to generate a delay signal, wherein the first threshold voltage is greater than the second threshold voltage;

an inverter, coupled to the delay comparator, for inverting the delay signal; and a logic unit, coupled to the enable end, the inverter and the current source, for generating the charging activation signal according to the enable signal and the inverted delay signal.

19. The circuit system of claim 18, wherein the logic unit is an AND gate.

20. The circuit system of claim 17, wherein the current mirror module comprises:

an operational amplifier, coupled to the over-current signal end, for comparing the over-current voltage and a reference voltage to generate a computation result;

a p-type transistor, comprising a source end coupled to the over-current signal end, a gate end coupled to the operational amplifier, and a drain end, for generating the current according to the computation result; and a second current mirror, coupled to the p-type transistor and the ground end, for duplicating the current to generate the first mirror current.

21. The circuit system of claim 17, wherein the output device further comprises an over-current transistor, coupled between the over-current signal end and the ground end, for determining whether the over-current signal end is electrically connected to the ground end according to an over-current signal.

22. The circuit system of claim 17, wherein the over-current flag pull-high resistor is coupled between the over-current signal end and the power end, and is utilized for determining flow of the current.

23. The circuit system of claim 17, wherein the current source charges the gate end of the output transistor by the charging current to determine an activation moment of the gate end.

24. The circuit system of claim 17, wherein the output device is a Universal Serial Bus (USB) switch device for determining whether the supply voltage is provided to an external electronic device according to the enable signal.

* * * * *